United States Patent [19]

Frey et al.

[11] 4,246,437

[45] Jan. 20, 1981

[54] SEALING APERTURES THROUGH WHICH ELECTRICAL TERMINALS PROTRUDE

[75] Inventors: Werner U. Frey, Thalwill, Switzerland; Ronald W. Lomax; Herbert W. Clark, both of Harlow, England; David W. Smith, Bishop's Stortford, England

[73] Assignee: International Standard Electric Corporation, New York, N.Y.

[21] Appl. No.: 965,724

[22] Filed: Dec. 1, 1978

[30] Foreign Application Priority Data

Dec. 2, 1977 [CH] Switzerland .................. 14748/77

[51] Int. Cl.³ .......................... B29D 1/00; B29C 6/00
[52] U.S. Cl. ............................. 174/52 PE; 174/525; 264/261; 264/272
[58] Field of Search ............ 264/261, 262, 263, 272, 264/261, 174; 29/460, 623.2, 623.4, 619, 621; 220/3.2, 3.3; 335/202; 174/65 R, 50.61, 50.62, 52 S, 52 PE, 59; 249/110, 119, 123, 129, 130

[56] References Cited

U.S. PATENT DOCUMENTS

| 3,062,981 | 11/1962 | Stoeckert et al. | 174/50.61 |
| 3,311,509 | 3/1967 | Sabatino | 29/623.2 |
| 4,126,292 | 11/1978 | Saeki et al. | 249/110 |

FOREIGN PATENT DOCUMENTS

883358 10/1971 Canada .................................. 249/119

Primary Examiner—James B. Lowe
Attorney, Agent, or Firm—John T. O'Halloran

[57] ABSTRACT

The apertures in one wall of an electrical component housing through which electrical terminals protrude are sealed with resin. The resin is applied to the housing wall at a remote area and caused to flow by capillary action along grooves to the required locations for sealing the apertures. In the case of a two part housing the parts of which join at the perimeter of the wall having the protruding terminals, the resin may also be caused to flow by capillary action into this join to seal it.

4 Claims, 6 Drawing Figures

SEALING APERTURES THROUGH WHICH ELECTRICAL TERMINALS PROTRUDE

This invention relates to the sealing of apertures in electrical component housings through which electrical terminals protrude.

According to the present invention there is provided an electrical component housing a part of which is formed by a wall having apertures therein through which electrical terminals protrude, wherein the outwardly facing surface of said wall is provided with a recess forming a reservoir for a quantity of a curable resin in liquid form, wherein said apertures are connected with the reservoir by channels formed in said surface, and wherein the dimensions of the terminals, the apertures, the channels and the reservoir are such that by filling the reservoir with the liquid resin to a depth insufficient to overflow the reservoir walls, the resin is caused to flow along the channels by capillary action thereby to reach said apertures and seal them by capillary action.

The invention also provides a method of sealing with a curable resin in liquid form a plurality of apertures in a wall of an electrical component housing through which wall electrical terminals protrude, wherein a quantity of the curable resin in liquid form is dispensed into a reservoir formed in the outwardly facing surface of said wall, which quantity is insufficient to overflow the walls of the reservoir, from which reservoir the resin spreads by capillary action along grooves formed in said surface which connect the reservoir with the apertures thereby to reach said apertures and seal them.

When a component is connected into a circuit by soldering for instance by being soldered to a printed circuit board by wave-soldering, it is common practice to use a flux to ensure good quality soldered joints. If the component is contained in a housing, and the apertures in the housing through which the terminals protrude are not sealed, the flux vapour is liable to penetrate into the interior of the housing where it may adversely affect the performance of the electrical component. Thus for instance in the case of a relay housing the flux vapour may contaminate the contacts forming a coating which adversely affects their electrical contact properties. One way to overcome this problem is to seal the apertures before the soldering.

This sealing can be achieved by designing the housing so that a bead is formed around the layout of terminal apertures. This bead forms the perimeter of a reservoir which is then filled with a casting resin. Disadvantages of this approach are that a relatively large amount of resin is required giving rise to a correspondingly large curing time, and furthermore the technique adds to the total height of the housing. In principle an alternative approach would be to inject a quantity of a curable resin directly into each aperture. A disadvantage of this is that it would tend to be labour intensive and therefore costly, and furthermore there is a great risk of the resin dispenser coming into contact with one or more of the terminals and contaminating them with resin in regions which prevent the subsequent formation of a soldered joint of acceptable quality. This problem is overcome according to the teachings of the present invention by arranging for the resin to be dispensed at one place, which can be a safe distance from the terminals, and then causing the resin to flow by capillary action to the places that require to be sealed.

There follows a description of two relay housings embodying the invention in preferred forms. The description refers to the accompanying drawings in which:

FIG. 1 is a view of the terminal side of a housing part for an electrical component;

FIG. 2 a view of the housing part of FIG. 1 seen from the side of the component;

FIG. 5 is a cross-section of a poured out terminal leading-through; and

Figure 1:
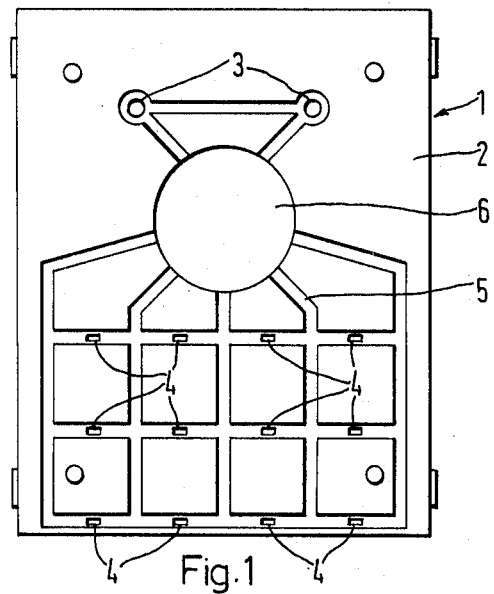
Figure 3:
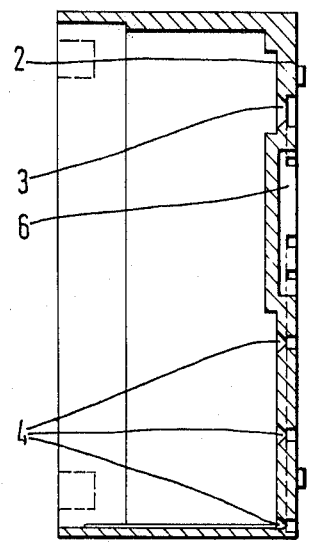
FIG. 3 is a cross-section of the housing part of FIG. 1.
Figure 2:
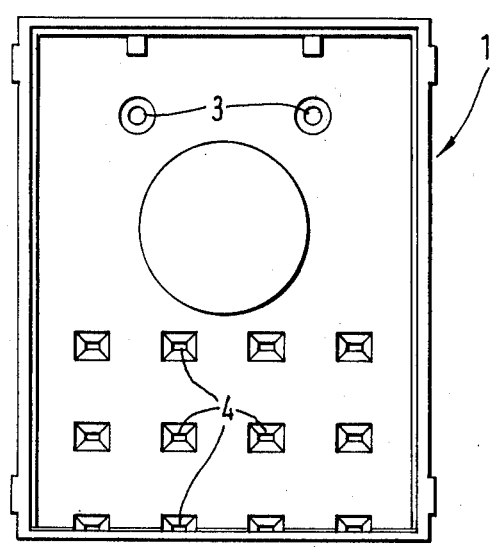

The housing part 1 shown in FIGS. 1 to 3 is intended for housing a miniature relay having two coil terminals and twelve terminals for four change-over contacts. The housing part 1, having the shape of a rectangular parallellepiped with one open wall, is closed by a not shown cover as the second housing part. The bottom 2 of the housing part 1 is opposite the open side, and is provided with two circular apertures 3 for the relay coil and twelve rectangular apertures 4 for the contact terminals of the relay. These openings in the housing are not so dimensioned that the terminals of the relay are positioned in the openings without clearance and therefore these apertures are not sealed against the penetration of soldering flux vapours or washing liquids, but an additional sealing must be provided.

Figure 4:
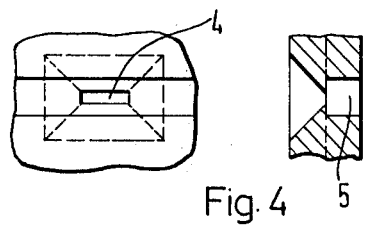
FIG. 4 is an enlarged cross-section of a leading-through of the housing part of FIG. 1.

The terminal openings 3 and 4 are connected with a pattern of grooves 5 each having a cross-section of a portion of a square millimeter which grooves are connected with a reservoir 6. If a given amount of casting resin is applied at the reservoir it will flow by capillary action along the grooves and into the apertures around the relay terminals. In the case of a thermally cured resin the housing is heated to cause the resin first to become less viscous and then solidify. This occurs very quickly due to the small amount of resin and the small cross-section of the channels. On the inside of the housing the terminal apertures are bevelled as is shown in FIG. 4 in an enlarged scale. The groove 5 of square cross-section is provided on its bottom with an aperture 4 which is enlarged into the inside on all sides with an angle of 45° to the longitudinal axis of the opening so that the influence of the capillary action becomes substantially zero and an excessive flow of resin along the terminal elements is avoided. At the same time the funnel-like enlargement of the apertures to the inside of the housing facilitates the insertion of the terminal elements into the corresponding openings.

Figure 5:
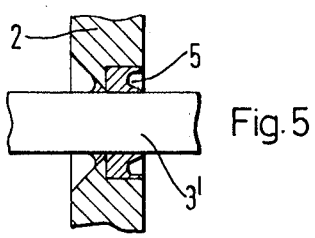

The circular apertures 3 for the coil terminals having a larger cross-section are provided with an annular groove to lead the resin around the terminals. FIG. 5 shows the cross-section of such a leading-through after the pouring and curing operation wherefrom it can be seen that the casting resin does not fill the groove completely, but adheres substantially to the walls, and that the bevelling of the apertures on the inside results in a restriction of the flow on the capillary action.

Figure 6:
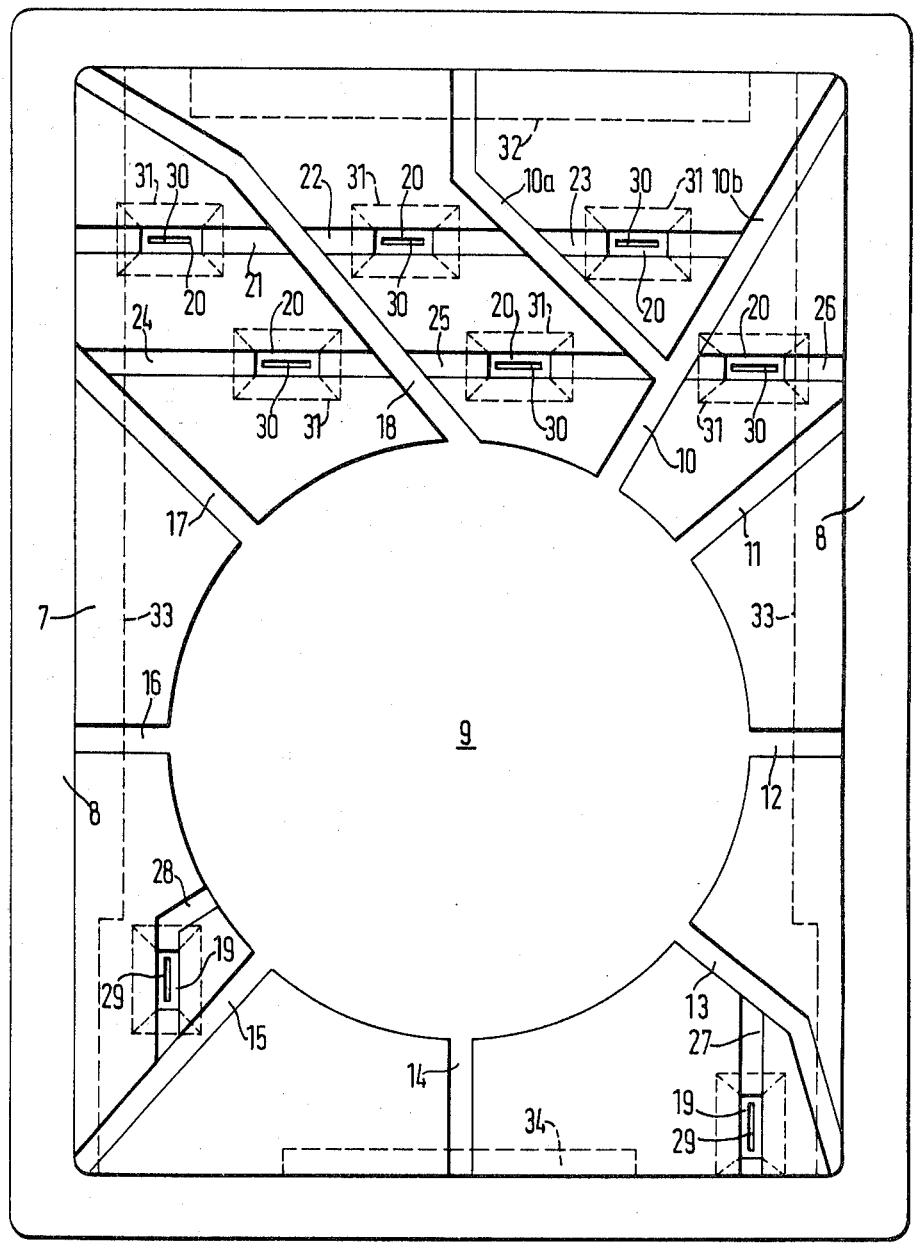
FIG. 6 is a view of the terminal side of a different housing for an electrical arrangement.

In the above described relay housing the walls of the housing are integral with the base portion of the housing through which the terminals protrude, and the housing is completed by a substantially flat lid. FIG. 6 shows the base 7 of a cradle relay housing also embodying the invention in a preferred form. In this relay housing the electrical components are fitted to the base, all the terminals extend through the base, and the side walls of the housing are integral with the cover 8. With this form of construction the seal to be made between the two parts of the housing lies in substantially the same plane as the seals to be made around the protruding terminals and hence it is generally convenient to use the one sealing operation to effect the edge sealing together with the terminal sealing.

The housing is like the previously described housing in that its reservoir 9 is circular. A circular reservoir is preferred because, in order to minimise the risk of the liquid resin front washing over the rim of the dosing point, it is desirable to arrange for this front moving under the influence of gravity to reach the whole of the perimeter at substantially the same instant. This may readily be achieved by dispensing the liquid resin into the centre of a circular dosing point.

Radiating from the reservoir 9 are nine main channels 10 to 18. With the exception of channel 18, entrances of all these channels leads radially away from the reservoir. This tends to facilitate entry of the resin into the channels by preserving the momentum of flow. It will be appreciated that until the liquid has started to enter a channel there is no capillary force to draw the liquid along that channel. With this in mind, the design may be modified to introduce an extra bend into channel 18 so that its entrance shall also lead radially away from the reservoir. The depth of these main channels 10 to 18 is equal to that of the reservoir so that there is no step at their commencement to impede the flow of resin.

Forks in the main channels can be tolerated, thus for instance main channel 10 forks into two portions 10a and 10b. In general however it is preferred to choose a design that minimises the number of forks, or eliminates them altogether, because the capillary attraction is lessened where the meniscus has to widen out before reaching the junction of the two new walls. In the present instance a design compromise was struck leaving a single fork in order to skirt around the two coil terminal openings 19 and the staggered array of six contact terminal openings 20, and to have the entrances of the main channels disposed approximately equidistantly around the perimeter of the reservoir while their outer ends are disposed approximately equidistantly around the perimeter of the base 7.

A further design consideration was the desire to have four of the main channels terminate in the four corners of the base. As explained earlier, in this particular design of housing it is desired that the resin shall not only seal the terminals in their openings, but also seal the perimeter of the base to the cover 8. It will be appreciated that the kind of Tee-junction presented to the resin at the end of a main channel terminating at a side edge of the base 7 is liable to be a greater impediment to liquid flow than that at a fork because the side wall of the cover may be flexed away from contact with any portion of the channel wall. At the corners, however, there is liable to be an interference fit between these two components, and this will facilitate flow of the resin across the junction. From the corners the resin will spread out by capillary action along the sides of the base provided that nowhere does the gap between the base and the cover become too great. Therefore it is desirable to have at least one channel leading to a corner, if not a channel leading to each corner. Alternatively the cover may be provided with one or more inwardly directed protrusions to register with the ends of channels that do not terminate in the corners. These protrusions are made to have suitable dimensions to ensure that they are in contact with the walls of the channels when the cover is fitted.

The terminal apertures 19 and 20 are connected with the main channels by way of six secondary channels 21 to 26. These secondary channels have the same width as the main channels, though this is not a necessary feature. Their depth however is less than that of the main channels. Typically they are half as deep. A particular reason for making them less deep than the main channels is so that where they join the main channels they should interrupt the main channel wall as little as possible and thereby not produce as great an impediment to liquid flow along the main channel as would be presented by a full depth fork in a main channel. Another reason is that a shallower secondary channel diverts less resin from flowing down the main channel. The secondary channels are arranged so that each terminal aperture can be filled from both ends. This improves the yield by providing an alternative route for the resin flow should a part of one of these secondary channels become locally blocked. When, as in this instance, the coil terminals 29 and contact terminals 30 are of flat construction, rather than around, it is preferred to make the secondary channels the same width as the terminal aperture. In choosing a width of terminal opening it must be remembered that the terminal may come to rest pressed hard up against one wall in which case the capillary forces promoting resin flow along the two sides will be very different in magnitude. Therefore the width of a terminal aperture should preferably be no greater than the sum of the feeding channel width and the terminal width. Also it has been found that a reduction in this terminal aperture width tends to reduce the height to which the resin creeps up the terminals.

It is not necessary for the main channels to extend right to the perimeter of the base. A full depth main channel may be halted at some distance from the perimeter and be continued to the perimeter as a shallower, secondary channel. This may be desirable for instance in order to delay the resin reaching the perimeter in its path down particularly short channels.

On the inwardly-facing face of the base 7, that is to say the face opposite the one having the reservoir and channels, the walls of the terminal apertures 19 and 20 are provided with 30° chamfers 31 in order to produce bevels that will limit the extent of the flow of resin along the terminals. Similarly 45° chamfers 32, 33 and 34 are provided on the same face at its perimeter in order to limit the flow of resin down the inner walls of the cover 8. In this instance the chamfers do not extend all the way round the perimeter but are interrupted in four places to provide four platforms co-operating with ledges formed on the inside walls of the cover so as to limit the depth of insertion of the base into the cover. In this particular construction of relay base the inwardly-facing face of the base is stepped with the result that chamfer 32 has a greater width than chamfer 34, and the width of both chamfers 33 is stepped. (This feature is dictated by design considerations in respect of the relay components, and is not determined by factors relating to the flow of the resin.).

For a particular relay housing base as depicted in FIG. 6 measuring 25.75 mm by 16.35 mm, all the channels are 0.6 mm wide, and so are the terminal apertures. The reservoir has a diameter of 12.5 mm and a depth of 0.6 mm, which is the same as that of the main channels. The secondary channels are only 0.3 mm deep.

One example of a suitable epoxy sealing resin is a two part mixture of materials sold by Ciba-Geigy consisting of 100 parts by weight of a resin sold under the designation MS 3900, and 35 parts by weight of a hardener sold under the designation MS 3911. It is preferred however to use a single-component ultraviolet light curing resin which enables rapid curing of the sealant when so illuminated. This eliminates the need to mix two component resins and avoids the problems associated with their limited pot-life with its attendant problems that the viscosity of the resin may rise too far before it has been able to reach all of the places requiring sealing. Suitable examples of ultra-violet light curing resins are those sold by Loctite under the designations 357 UV curing resin and Glass-bond UV curing resin. When using an ultra-violet light curing adhesive either the base or the cover or both should be relatively transparent to the radiation concerned. When using a base made of a black 30% glass loaded flame retardant thermoplastic polyester we have found that adequate transparency is obtained using a cover made of a polyamide sold by Grilon UK under the designation Grilamid Type 7R55. Typically about three drops of such a resin are sufficient adequately to fill the reservoir of a relay housing of the dimensions set out in the preceding paragraph. To cure the resin the base is first exposed to the ultraviolet light, and then one major side of the cover, followed by the other major side.

The resulting hermetic seal typically has a leak rate of about $3 \times 10^{-6}$ milleliter atmospheres per second.

What is claimed is:

1. An electrical component housing a part of which is formed by a wall having apertures therein through which electrical terminals protrude, wherein the outwardly facing surface of said wall is provided with a recess forming a reservoir for a quantity of a curable resin in liquid form, wherein said apertures are connected with the reservoir by channels formed in said surface, and wherein the housing material, the dimensions of the terminals, the apertures, the channels and the reservoir are such that by filling the reservoir with the liquid resin to a depth insufficient to overflow the reservoir walls, the resin is caused to flow along the channels solely by capillary action and to reach said apertures and seal them solely by capillary action.

2. A component housing as claimed in claim 1, wherein the layout of the channels includes main channels communicating directly with the reservoir and secondary channels branching off the main channels, and wherein the depth of the main channels is greater than that of the secondary channels.

3. A component housing as claimed in claim 1, wherein the width of each aperture is no greater than the sum of the width of the terminal protruding therethrough and the width of any channel with which that aperture directly communicates.

4. A component housing as claimed in claim 1, wherein the apertures through which the terminals protrude are bevelled on the inwardly facing surface of the wall so as to restrict the extent of the capillary flow of the liquid resin along the terminals into the interior of the housing.

* * * * *